United States Patent [19]

Kumar

[11] Patent Number: 5,229,358
[45] Date of Patent: Jul. 20, 1993

[54] METHOD AND APPARATUS FOR FABRICATING SUPERCONDUCTING WIRE

[75] Inventor: Nalin Kumar, Austin, Tex.

[73] Assignee: Microelectronics and Computer Technology Corporation, Austin, Tex.

[21] Appl. No.: 621,390

[22] Filed: Dec. 3, 1990

Related U.S. Application Data

[63] Continuation-in-part of Ser. No. 495,385, Mar. 16, 1990, which is a continuation-in-part of Ser. No. 366,853, Jun. 15, 1989, abandoned.

[51] Int. Cl.$^5$ .............................................. H01L 39/24
[52] U.S. Cl. ................................... 505/1; 204/192.24; 204/298.24; 505/731; 505/740
[58] Field of Search ..................... 427/62; 204/192.24, 204/298.24, 298.25, 298.26; 118/718; 505/1, 704, 730-732, 740, 813, 816, 818, 819, 821

[56] References Cited

U.S. PATENT DOCUMENTS

| | | | |
|---|---|---|---|
| 3,983,521 | 9/1976 | Furuto et al. | 335/216 |
| 4,078,229 | 3/1978 | Furuto et al. | 29/599 |
| 4,202,921 | 5/1980 | Newkirk et al. | 428/662 |
| 4,581,289 | 4/1986 | Dietrich et al. | 428/379 |
| 4,611,390 | 9/1986 | Tanaka et al. | 29/599 |
| 4,652,697 | 3/1987 | Ando et al. | 174/128 |
| 4,765,055 | 8/1988 | Ozaki et al. | 29/599 |
| 4,791,241 | 12/1988 | Ando et al. | 174/125.1 |
| 4,794,688 | 1/1989 | Wada et al. | 29/599 |
| 4,803,310 | 2/1989 | Zeitlin et al. | 174/128 |
| 4,808,488 | 2/1989 | Chevrel et al. | 428/614 |
| 4,826,808 | 5/1989 | Yurek et al. | 505/1 |
| 4,842,366 | 6/1989 | Sawada et al. | 350/96.30 |
| 4,842,704 | 6/1989 | Collins et al. | 204/192.24 |
| 4,845,308 | 7/1989 | Womack, Jr. et al. | 174/15.4 |

FOREIGN PATENT DOCUMENTS 0285168 3/1988 European Pat. Off. .

OTHER PUBLICATIONS

"Ytrium Tape Lets Users Be Flexible," *Focus on Japan*, vol. 2, No. 2, Mar. 1989, pp. 1-4.

"Studies of High Temperature Superconductors-Advances in Research and Applications", Nova Science Publishers, Commack, edited by Anant Narlikar, vol. 2, pp. 1-26.

Okada et al., "Ag-Sheathed Ti-Ba-Ca-Cu-O Superconductor Tape with Tc-120K," *Japanese Journal of Applied Physics*, vol. 27, No. 12, Dec 1988, pp. L2345-2347.

Kohno et al, "Critical Current Density of Y-Ba-Cu Oxide Wires," *Japanese Journal of Applied Physics*, vol. 25, No. 10, Oct. 1987, pp. 1653-1656.

Matsuda et al, "Superconducting Tape-Shaped Wire by Y1Ba2Cu3O7-d With Jc=2000 A/cm squared," Mat. Res. Soc. Symp. Proc. vol. 99, pp. 695-698.

Togano et al, "Developments of Tape and Wire Fabrication Processes for High TcBa2YCa3O7-y Oxide Superconductors," Materials Research Society Symposium Proceedings, vol. 99, 1988, pp. 191-196.

Sadakata et al, "Fabrication and Superconducting Properties of High Tc Oxide Wire," Materials Research Society Symposium Proceeding, vol. 99, 1988, pp. 293-296.

Dietrich et al, "High Field NbN Superconductor on Carbon Fibers," Insitute fur Technische Physik, Karlsruhe, FRG, pp. 684-697.

*Primary Examiner*—Aaron Weisstuch
*Attorney, Agent, or Firm*—Johnson & Gibbs

[57] ABSTRACT

A superconducting wire which includes a base wire and at least a superconduction layer formed on the base wire. The superconduction layer may be formed by using a sputtering system for depositing a film of high temperature superconductor material on the base wire. The superconducting wire may further include an adhesion layer, a diffusion barrier layer and/or a protection layer. Several superconducting wires may be grouped together in a metal matrix to form a composite superconducting wire.

6 Claims, 8 Drawing Sheets

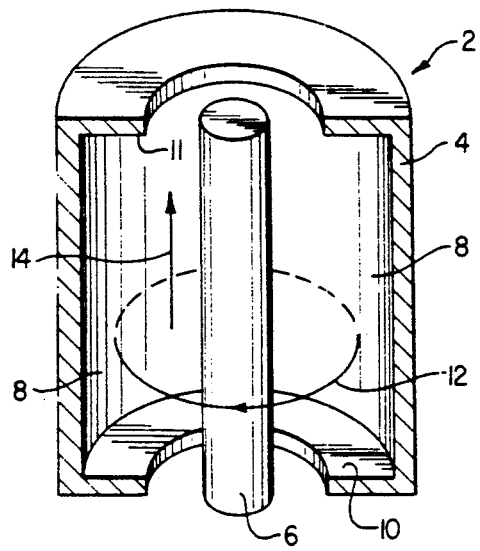
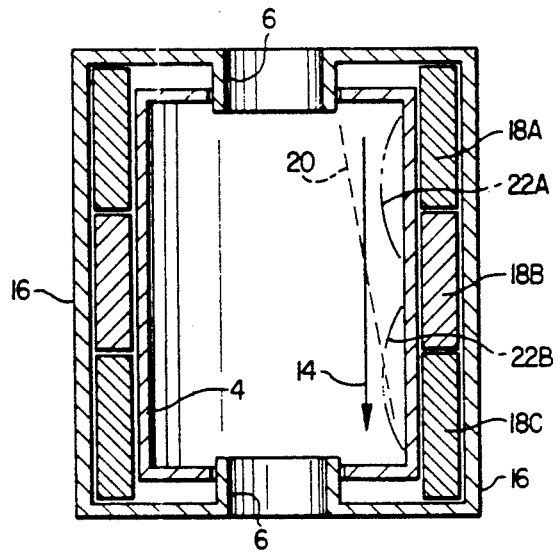
FIG. 1 (PRIOR ART)
FIG. 2 (PRIOR ART)
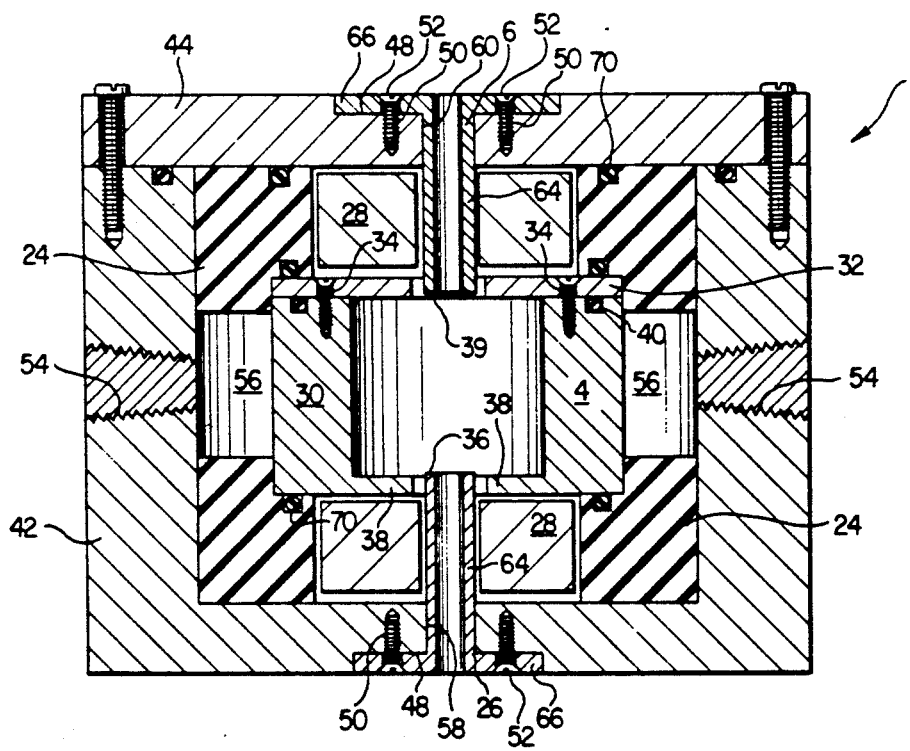
FIG. 3

METHOD AND APPARATUS FOR FABRICATING SUPERCONDUCTING WIRE

CROSS REFERENCE TO RELATED APPLICATIONS

This application is a continuation-in-part of copending U.S. patent application Ser. No. 07/495,385 entitled "Improved Cylindrical Magnetron Sputtering System", filed on Mar. 16, 1990, which is a continuation-in-part of a co-pending U.S. patent application Ser. No. 07/366,853, entitled "Cylindrical Magnetron Sputtering System", filed on Jun. 15, 1989, and now abandoned, which applications were filed by the same inventor and assigned to the assignee of the present invention. Such applications and the disclosures therein are hereby incorporated herein by reference.

BACKGROUND OF THE INVENTION

1. Field of the Invention

The present invention relates to superconducting wires and, also, to a method and apparatus for fabricating such wires using a cylindrical hollow cathode magnetron sputtering system for depositing a film or films on cylindrical substrates.

2. Description of Prior Art

The phenomena of superconductivity, i.e., the ability to conduct electricity with almost no resistance, was first discovered in 1911 and has been the subject of intense scientific curiosity ever since. It has been known for many years that a number of elements, alloys and compounds, when cooled below a critical temperature approaching absolute zero (0 K), enter into a zero electrical resistance state. The superconducting transition temperature, or Tc, depends on the particular superconducting material or superconductor. When a superconductor is at a temperature which is higher than its critical temperature, it does not conduct electricity in an efficient manner in that some of the electrical energy is converted to heat. Such heat losses, however, may be reduced or eliminated when the superconductor is cooled below its critical temperature and the superconductor becomes a most efficient conductor of electricity.

In the past, only metallic superconductors having relatively low critical temperatures were generally available. Such superconductors include niobium-tin (NbSn) and niobium titanium (NbTi) superconductors The low transitional temperatures of these superconductors (near 20 K) dictated the use of liquid helium, which has a boiling point of about 4.2 K, as a coolant. Unfortunately, liquid helium cooling is very expensive, not only because helium is a costly, rare resource, but also because liquification of helium requires a large scale system. Thus, the use of superconductors of this type was very limited given the difficulty and expense of maintaining the temperature of superconductors below their critical temperatures.

Recently, however, ceramic oxide materials have been produced which exhibit superconductivity at much higher temperatures than the previous metallic superconductors. The critical temperatures of these newly-discovered ceramic superconductors are generally about 40 K, and in some instances even higher than 77 K, the boiling point of liquid nitrogen. Such ceramic superconductors can be cheaply maintained below their critical temperatures using inexpensive liquid nitrogen for cooling. The ability to produce superconductivity in a material cooled by liquid nitrogen completely changes the economics which have heretofore restricted the applications to which the phenomena of superconductivity could be applied.

The total number of applications for this new class of high temperature superconductors (HTS) can be stretched as far as the human imagination goes and may include the field of electrical power transmission, for example, MHD power generation, fusion power generation, power transmission and reservation, etc.; the field of transportation, for example, magnetically levitated vehicles, magnetically propelled chips, etc.; the medical field, for example, high energy beam radiation, etc.; the scientific field, for example, very sensitive sensors for detecting a very weak magnetic field, etc.; and the electronics field, for example, high speed/low power switching devices.

While the range of possible uses for the new HTS ceramic oxide materials is large and varied, a serious problem exists which could impede the full realization of those uses. Since the new HTS materials are oxides, they are inherently brittle and difficult to form directly into useful components such as wires, ribbons, tapes, fibers, or composites for the fabrication of superconducting devices.

Heretofore, the prevalent method used to produce the HTS ceramic oxides has been to mechanically mix powders of dioxides or carbonates of a rare earth, i.e., a lanthanum series element (such as lanthanum or yttrium); an alkaline earth metal element (such as barium or strontium); and copper in the 1-2-3 structure of the superconductor; calcine the mixture to remove water or other volatiles; and then fire the powder mixture in an oxygen atmosphere at a temperature sufficiently high to produce the desired superconducting phase. The shortcomings of this technique, however, are evidenced by variations in the compositions of the fired ceramic material and, consequently, variations in the chemical and physical properties of the resulting superconductors. Moreover, the mixing process requires several hours and sometimes introduces impurities from the mixing vessel (usually a ball mill) into the ceramic mixture.

As mentioned above, the HTS ceramic materials are deficient in some of the essential physical properties needed to permit ready fabrication and practical usage of structures made from such materials. Most notable of these deficiencies are the extreme brittleness and poor mechanical strength of the superconducting ceramic structures, which inhibit formation of shaped structures, such as coils or wires, and the low current carrying capabilities of the superconducting ceramic. The superconducting ceramic material also exhibits signs of microcracking which are a further indication of its brittleness and would also affect its critical current density Jc. In addition, the superconducting ceramic material, as generally produced, is of rather low density and is difficult to densify, resulting in low environmental stability and sensitivity to moisture and $CO_2$. Low density also leads to poor superconducting and mechanical properties.

Several methods for the fabrication of HTS wires have been developed in an attempt to overcome the deficiencies of HTS ceramic materials described above. In one method, one or more precious metals selected from the class consisting of silver, gold, and one of the six platinum metals are added to the ceramic materials. Although this method produces a cermet having greater strength and flexibility than ceramic material, the maximum current densities are decreased. In the most popular method, the ceramic superconducting oxide powder is enclosed in a metallic (silver or stainless steel) sheet which is heat treated to a suitable high temperature. After heat treatment, the composite is cold or hot drawn or spun to reduce its diameter so as to provide an elongated superconductor wire with a desired diameter. Then the wire is subjected to a thermal process with a temperature higher than 900° C. for a few hours. This latter method also has certain drawbacks. The wire made this way is not very flexible. Moreover, the difference between the thermal coefficient of expansion (TCE) of the superconductor and the metal sheet generates very high stresses at the interface during and after the high temperature heat treatment. This stress is usually tensile on the superconductor, thus generating microcracks and catastrophic failures in the oxide superconductor. The tensile stress in the oxide also results in a very low current density.

Other methods have formerly been developed in order to allow the practical use of superconducting materials. Several attempts have been made in the past to apply a thin coating of superconducting material to a base wire to fabricate a superconducting wire. One such technique, known as film deposition, involves supplying component HTS materials for a growing layer from external sources and depositing those materials down upon a substrate. Such deposition processes are generally carried out in a vapor phase within a reduced pressure atmosphere of a selected gas or gases, or in a vacuum. If the material to be deposited does not react chemically during deposition, the process is referred to as Physical Vapor Deposition or PVD. If, on the other hand, the deposited material is a product of a chemical reaction which occurs within the vapor phase, either on the surface or in the vicinity of the substrate, the process is known as Chemical Vapor Deposition or CVD. Hybrid methods of film deposition, i.e., those which involve both physical and chemical processes, are also known.

One method of physically depositing a film upon a substrate is known as sputtering. A typical sputtering system includes a target (a cathode) and a substrate holder (an anode) positioned so that the surface of a substrate upon which the film to be deposited, which substrate is placed on the holder, faces the target. The target is a plate of the material to be deposited or from which a film is to be synthesized. The target is connected to a negative voltage supply, either dc or rf, and the substrate holder may be either grounded, floating, or biased, as well as either heated, cooled, or some combination thereof. A gas, at a pressure from a few millitorr to about 500 mTorr, is introduced into a chamber containing the substrate holder and target to provide a medium in which a glow discharge plasma can be initiated and maintained. When the glow discharge is started positive ions strike the target and stimulate the removal of mainly neutral target atoms therefrom by momentum transfer. These atoms then condense into a thin film formed upon the surface of the substrate placed on the substrate holder. In addition, various particles other than neutral atoms, e.g., electrons and ions, are also produced at the target which may have a significant effect on the properties of the film deposited on the substrate.

Examining the sputtering process in more detail, a low pressure abnormal negative glow plasma discharge is maintained within the chamber between the cathode (target) and the anode (substrate holder). Electrons emitted from the cathode due to ion bombardment thereof are accelerated to near the full applied potential within the cathode dark space, i.e., a relatively nonluminous region between the cathode and the negative glow. Such high energy electrons enter the negative glow as so-called primary electrons where they collide with gas atoms and produce the ions required to sustain the plasma discharge. The primary electron mean free path increases with both increasing electron energy and decreasing pressure within the chamber. At low pressures, ions are produced far from the cathode where their chances of being lost are great. Additionally, many primary electrons hit the anode with high energies, causing a loss that is not offset by impact-induced secondary emission. Thus, ionization efficiencies are low. As the pressure within the sputtering chamber is increased at a fixed voltage, the primary electron mean free path decreases and larger currents are possible; however, at high pressures within the chamber the sputtered atom transport which occurs has been found to be reduced by collisional scattering.

It has also been found that a magnetic field extending parallel to the cathode surface can restrain primary electron motion to regions in the vicinity of the cathode and thereby increase ionization efficiency. It has been further found that the $E \times B$ electron drift currents can be caused to close on themselves by the use of cylindrical cathodes, which thereby prevent the $E \times B$ motion from causing the plasma discharge to be swept to one side. Based upon the foregoing, various cylindrical magnetron systems have been developed. Such systems having cylindrical, hollow cathodes are known as inverted magnetrons or cylindrical hollow magnetrons. A typical cylindrical hollow magnetron sputtering system includes one or more solenoids, wound on a core of magnetic material, and placed coaxially and externally to or within the cathode to serve as a field generator. Typically, the anodes are also joined to tubular backstrap and are both made from magnetic material. The aforementioned anode design effectively reduces field curvature near the ends of the anode and also increases the magnetic field strength in the plasma located inside the cathode. Where a plurality of solenoids are used, current ratios of those solenoids may be controlled to provide a variety of field shapes. To avoid changes caused by unequal heating of the solenoids, they are also typically connected in series with one another.

Heretofore, cylindrical hollow magnetron systems have been recognized as useful for coating substrates of complex shapes where: (a) the hollow cathode has a uniform wall erosion rate; (b) the substrate surface is far enough from the ends so that end losses can be ignored; and (c) the object to be coated has an unobstructed view of the cathode surface. Thus, heretofore, the usefulness of cylindrical hollow magnetron sputtering systems has been viewed as involving positioning the anode where end losses may be ignored and positioning the object to be coated so that it is always completely exposed to the cathode surface.

The deposition of thin film coatings onto cylindrical substrates such as wires and fibers, which have not been recognized as having complex shapes, has heretofore involved either rotation of the substrate while moving it relative to a uni-directional coating material source, such as a planar diode, or other steps wholly unrelated to the processes described herein. Needless to say, those prior processes which involve rotating a wire or fiber being coated with a thin film require the use of complex rotating means. Even using the most precise rotating systems now available cannot ensure a film of sufficient uniformity of thickness and quality for a number of currently developing applications. For example, it is becoming highly desirable to be able to deposit films of a few microns in thickness upon optical fibers, ceramic fibers, thin wires and other such cylindrical substrates. Certain new applications require the deposit of one or more films of metallic, superconducting, dielectric, electro-optic, magnetic and/or piezo-electric materials onto the surface of fibers and wires in highly precise and uniform layers.

In addition to the problems of film thickness and uniformity discussed above, the prior art methods of film deposition include a number of other shortcomings which render them inefficient in coating cylindrical substrates. For example, it has been found that using a planar magnetron sputtering system to apply relatively thick films over very large lengths of fibers is extremely inefficient because of the inherently low cathode material utilization characteristic of such systems when thin fibers are used as substrates.

The method and system of the present invention overcomes many of the disadvantages of prior art sputtering systems when the substrates to which a film is to be applied are wires and fibers.

SUMMARY OF THE INVENTION

The present invention provides a superconducting wire and a film deposition apparatus and method for fabricating the superconducting wire by depositing a film (layer) or films (layers) on generally cylindrical substrates such as base wires. The film deposition system of the present invention includes a sputtering system and means for moving or causing the base wire to move through that sputtering system. A plurality of sputtering systems may be connected in series for successively depositing a plurality of films on the base wire as it passes from one sputtering system to another.

In another aspect of the present invention, a plurality of superconducting wires constructed in accordance with the present invention are disposed in a metal matrix, using standard metal matrix techniques, so as to form a composite superconducting wire.

In yet another aspect of the present invention, a superconducting wire is fabricated by depositing on a base wire a partial superconduction layer consisting of at least some, but not all, of the elements of an HTS material and reacting the partial superconduction layer with the other elements of the HTS material such that a complete superconduction layer is formed on the base wire.

Accordingly, it is an object of the present invention to provide a superconducting wire suited for a variety of applications and which may be fabricated in accordance with the film deposition method and apparatus described herein.

It is another object of the present invention to provide a composite superconducting wire which includes a plurality of superconducting wires fabricated in accordance with the present invention.

BRIEF DESCRIPTION OF THE DRAWINGS

Other objects, advantages and novel features of the present invention will become apparent from the following detailed description of the invention when considered in conjunction with the accompanying drawings wherein:

FIG. 1 is a cross-sectional perspective view of a prior art cylindrical hollow magnetron;

FIG. 2 is a cross-sectional, schematic view of a prior art cylindrical hollow magnetron sputtering source;

FIG. 3 is a cross-sectional view of a sputtering system according to the teachings of the present invention;

DESCRIPTION OF THE PREFERRED EMBODIMENTS

Figure 4:
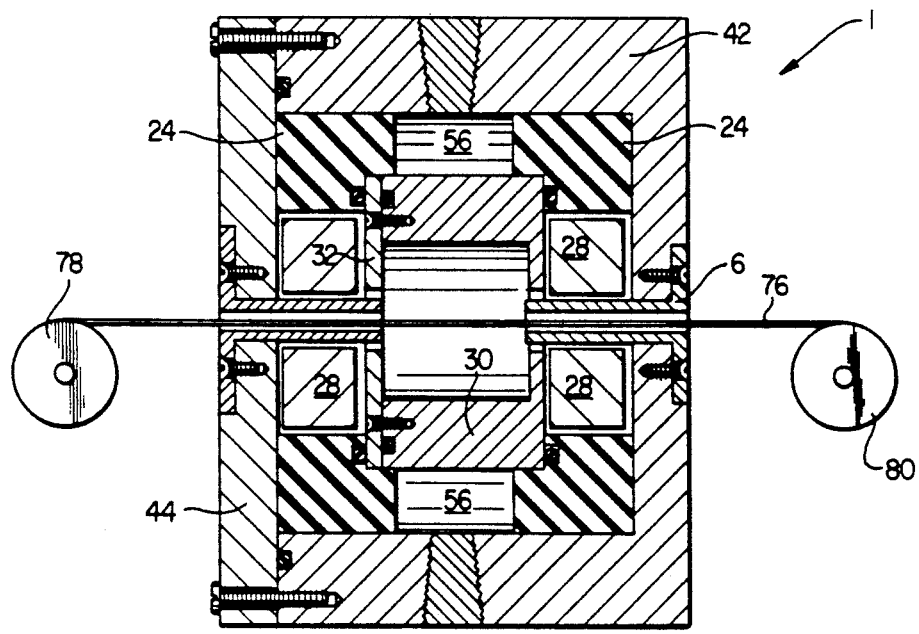
FIG. 4 is a cross-sectional view, partially schematic, of a sputtering system and substrate moving system according to the present invention.

Referring now to the drawings wherein like reference numerals designate the same or similar elements throughout the several views, FIGS. 1 and 2 show prior art cylindrical hollow magnetron sputtering systems, variations of which, described further below, form a part of a film deposition system according to the present invention. More specifically, FIG. 1 shows a cylindrical hollow magnetron, generally designated by reference numeral 2, as described in the Description of Related Art section above. Magnetron 2 may be seen to comprise a cathode 4 and an anode 6. A plasma sheet, commonly formed in an atmosphere of argon gas surrounding the magnetron 2, is indicated by shade lines 8. Circular end members 10 and 11 are electron reflecting surfaces formed of materials well known to those skilled in the art. Arrow 12 indicates the direction of E×B electron motion and arrow 14 indicates the direction of the magnetic field.

Referring now to FIG. 2, there is shown in greater detail a typical prior art cylindrical hollow magnetron sputtering source. This source also illustrates design features discussed in the Description of Related Art section above. For example, the anodes 6 are shown jointed to a tubular backstrap 16 which is formed of magnetic material to reduce field curvature near the ends of the cylindrical space and to increase the field strength in the plasma inside the cathode 4. Additionally, between the cathode 4 and the tubular backstrap 16 is disposed a solenoid 18 which is divided into a plurality of coils, three of Which 18A, 18B, 18C are shown in FIG. 2. As discussed above, the ratios of the different currents within the coils 18A, 18B, 18C are often controlled to provide a variety of magnetic field shapes including wedges and double traps, as illustrated by magnetic field lines 20 and 22A, 22B respectively.

FIG. 3 is a cross-sectional view, not necessarily to scale (as are none of the FIGS.), of a cylindrical hollow magnetron sputtering system 1 for use according to the teachings of the present invention. This system 1, like the prior art system shown in FIG. 2, includes a cathode 4 and two anodes 6. Additionally, this system 1 includes two electric insulators 24, an especially modified backstrap 42, and two ring-shaped permanent magnets 28. Details regarding each of the elements forming the embodiment of FIG. 3 are set forth below.

Cathode 4 comprises a container element 30, top 32, and means 34 for connecting top 32 to container element 30. This latter means is shown as a plurality of screws 34 driven through an equal number of holes through the top 32 into corresponding tapped holes in the container element 30. Of course, other means for connecting top 32 to container element 30 may be employed. For example, top 32 and container element 30 may be provided with engaging threads or interlocking slots and notches. It is within the scope of the present invention to employ any conventional connecting means to connect top 32 to container element 30.

The precise dimensions of the various elements of FIG. 3 are not limited to any particular range. However, because a system according to the present invention has actually been constructed and operated and found to be extremely effective in coating thin cylindrical substrates, the approximate dimensions of the embodiment of the system actually constructed are set forth herein so that those skilled in the art may more readily construct a preferred embodiment of the invention for coating thin cylindrical substrates. Referring again to FIG. 3, it may be seen that the container element 30 has an inner cylindrical diameter, an outer cylindrical diameter, a height, and a bore hole diameter (which bore hole is formed axially through the bottom center of the container element 30). In the embodiment of the present invention actually constructed, the bore hole diameter is about one-half inch, the inner cylindrical diameter is about one and one-quarter inch, the outer cylindrical diameter is about two and one-half inches, and the height of container element 30 is about one and three-eighths inch. The top 32, which needs to be only slightly larger than the major opening of the container element 30, has a diameter in the actually constructed embodiment which is about equal to the outer cylindrical diameter of container element 30, that is, two and one-half inches. The top 32 is about one-eighth inch thick, as is the bottom portion 38 of the container element 30. The top 32, like the container element 30, also has a central axial hole 39 extending therethrough which is about one-half inch in diameter. Other dimensions, such as thread size and depth of the tapped holes and the width and depth of the O-ring channel 40 are much less significant and are not set forth herein. In the actually constructed embodiment, both the top 32 and the container element 30 were formed of copper by conventional techniques; however, all such conventional construction techniques and alternative cathode materials, well known to those skilled in the art, should be considered to be within the scope of the present invention.

Surrounding the cathode 4 is an interconnectible structure comprising anodes 6, a magnetic backing plate 42 and a magnetic backing plate top 44. Although plate 42 and top 44 are somewhat similar to container element 30 and top 32 (e.g., the two groups both comprise a receptacle-like element and a closure-like element), there are a number of significant structural differences between them. First, the bottom of plate 42 and the top of top 44 are adapted to receive the anodes 6. In FIG. 3 this adaption may be seen to include having indented portions 48 and tapped holes 50 to receive screws 52 that pass through certain portions of the anodes 6. Additionally, container element 42 has a number of side openings 54 (two are shown in FIG. 3) to allow coolant to be pumped into the inner chamber 56, to allow coolant to leave inner chamber 56, and to allow an electrical connection to be made to cathode 6. Further details about these openings 54 are discussed below in connection with FIG. 14. Also, it is important to note that magnetic stainless steel is a preferred material for use in forming (by conventional means) plate 42 and top 44, although other suitable materials, well known to those skilled in the art, may be employed. Significant dimensions of the actually constructed plate 42 are: an outer diameter of about five inches, an inner diameter of about three and one-half inches, a height of about three and one-half inches, and a bottom thickness of about one-half inch. The top 44 has an overall diameter of about five inches and a thickness of about one-half inch. Central holes 58 and 60 that pass through container element 42 and top 40, respectively, have diameters of about one-half inch. Holes 58 and 60 are aligned with holes 36 and 39, respectively, in the container 30 and the top 32.

The anodes 6 are suitably formed of either copper or aluminum and have barrel portions 64 and flange portions 66. Barrel portions 64 of the two anodes 6 pass through aligned holes 58 and 36, and 60 and 39, respectively. Flange portions 66 of the anodes 6 are adapted to be received into the indentions 48 and are connected to either top 44 or plate 42 by connecting means such as screws 50. In the actually constructed embodiment of anodes 6, barrel portions 64 are about one and one-quarter inch long and flange portions 66 are about one-eighth inch thick.

The system shown in FIG. 3 also includes two generally ring-shaped electric insulators 24 (although only one such insulator could be required in certain embodiments of the present invention). Electric insulators 24 are sized and shaped so as to be snugly disposed within the enclosure formed by elements 42 and 40 when joined and, at the same time, to snugly hold cathode 4. It may also be noted that electric insulators 24 each have slots 70 adapted to receive O-rings for sealing purposes. Electric insulators 24 may be formed of Teflon, a ceramic or any number of other materials known to those skilled in the art by any number of known, conventional techniques.

Finally, it is important to note that both the embodiment of the system of the present invention that was actually constructed and the one shown in FIG. 3 include permanent magnets 28. These magnets are used to confine and enhance the plasma within the cathode 4. While two ring-shaped magnets are shown in FIG. 3, other permutations and arrangements of permanent magnets will be discussed in detail below.

Referring now to FIG. 4, it may be seen that the cylindrical hollow cathode magnetron of FIG. 3 has a structure that allows an elongate cylindrical substrate to be passed therethrough. In FIG. 4, the long cylindrical substrate is designated by reference numeral 76 and reference numerals 78 and 80 designate schematically represented substrate reel-out and substrate reel-in means. Thus, it should be appreciated that the structure of the cylindrical hollow cathode magnetron of the present invention is ideally suited for passing an elongate, cylindrical substrate therethrough.

Based upon the foregoing discussion, those skilled in the art should appreciate that the elements of the present invention described above constitute a superb solution to the shortcomings of the prior art relating to a lack of a mechanically simple means for uniformly coating an elongate cylindrical substrate. As shown in FIG. 4, as the substrate 76 is pulled at a constant rate through the axis of the cathode 4 all portions of the substrate 76 will be uniformly exposed to the sputtering process. Thus, it should be abundantly clear to those skilled in the art how easily a uniform coating may be deposited on a cylindrical substrate using the structure of the present invention heretofore described.

With respect to the operation of the various elements described above, those skilled in the art should readily appreciate that the cylindrical hollow cathode magnetron must be disposed in a vacuum chamber that is evacuated (to a pressure of, e.g., $10^{-5}$ to $10^{-6}$ torr) and then back-filled with one of any number of gases, e.g., argon. Those skilled in the art should further appreciate that when a high negative dc voltage (e.g., 300-1000 volts) power supply is connected to the cylindrical cathode 4, a glow discharge plasma is generated because of glow discharge phenomena within the hollow cavity of the cathode 4. The magnetic flux lines confine most of the plasma near the cathode. During the sputtering operation, energetic positive argon ions from the plasma (assuming an atmosphere of pure argon gas is employed in the system) are accelerated towards the negative potential of the cathode surface and hit it with high energy. Due to the momentum exchange which occurs as a result of the impact between the Ar+ ions and the surface of the cathode 4, atoms are ejected from the cathode material and these atoms coat the surface of any object disposed within the hollow cathode cavity.

If pure argon is used as the sputtering gas, a thin film of the same material as the target surface of the cathode is deposited on any object disposed within the hollow cathode cavity. In this matter, materials such as aluminum, YBCO, BiSrCaCO, copper, platinum, magnetic glasses, $PVFD_2$, and Teflon can be deposited on the surface of fibers passed through the cathode. However, if another reactive gas such as $O_2$, $N_2$, $CO_2$, $CH_4$, or $NH_3$ is added to the chamber containing the sputtering apparatus in addition to argon, the reactive gas reacts with the sputtered metal atoms and forms compounds which are then deposited on the surface of a fiber being passed through the cylindrical hollow cathode magnetron (hereinafter, "CHCM") cavity. Sputtering materials such as AlN, ZnO, $LiNbO_3$, $Al_2O_3$, and $TiO_2$ can be fabricated using a properly chosen reactive gas in the chamber during sputtering along with a properly chosen cathode material.

CHCM systems according to the present invention may be operated with either dc voltage or high frequency alternating voltage. When using insulating cathode material, an rf voltage (typically 13.56 MHz) is used to avoid charging up the cathode. As is generally known to those skilled in the art, the application of an rf voltage causes a negative dc potential to develop on the cathode, which negative dc potential is often referred to as the "self bias voltage" which results in sputtering.

There are several ways in which the coating process may be controlled in a CHCM according to the teachings of the present invention. First, compound coatings which vary all the way from metallic to stoichiometric compounds may be obtained by changing the percentage of a reactive gas to the argon gas comprising the sputtering atmosphere. Second, the coating properties can be changed by varying the applied voltage and thus the energy of the ions. For example, increasing the energy of the ions produced improves the adhesion of the coating to the fiber. The coating process may also be controlled by varying the speed at which the cylindrical substrate is moved through the CHCM. In general, the slower the substrate is moved through the apparatus, the thicker the coating which is formed on the surface thereof.

Another parameter relevant to the operation of the sputtering system of the present invention is that of substrate temperature. As the substrate passes through the sputter module its temperature rises because of electron/ion bombardment as well a because of the condensation of deposited material onto its surface. When the substrate is, for example, a wire, the temperature of the wire can be controlled by changing the sputtering parameters which affect the rate of electron bombardment on the wire. This can be very easily and effectively accomplished by varying the magnetic field within the sputter module. Stated another way, by changing the magnetic field confinement efficiency, the temperature of a wire substrate can be varied over a wide range. Also, by increasing the pressure of the working gas forming the atmosphere around the sputtering apparatus the energy of the depositing material is decreased due to an increase in the number of gas phase collisions which results in a relatively lower wire temperature. As can be seen from the foregoing, the capability of modifying the temperature of a wire substrate can enhance the versatility of the present invention. For that reason, certain preferred embodiments of the present invention include heater coils as further discussed below.

Usually, wires and fibers and similar substrates are either electrically unbiased (i.e., electrically floating) or grounded. However, in certain cases, a small negative voltage (e.g., 25 to 500 volts) is applied to the substrate. By changing the voltage applied to a wire substrate, the energy of the gas ions from the plasma bombarding the wire can be changed. This technique is commonly referred to as "bias sputtering" and results in the production of several useful properties in thin films such as lower intrinsic stress, smaller grain sizes, improved mechanical properties and better microstructure. In embodiments of the present invention in which bias sputtering is to be employed in connection with metallic and electrically conductive wires the bias voltage may be applied by simply connecting a dc power supply directly to the wire. If the wire is not electrically conductive but a electrically conductive material is being deposited on the wire, a wire puller pinch roller (discussed below in connection with the description of FIG. 14) can be electrically charged so that the freshly deposited conductive thin film acts as a bias medium. In both of the above two cases, either dc or rf bias voltage may be applied.

Figure 5:
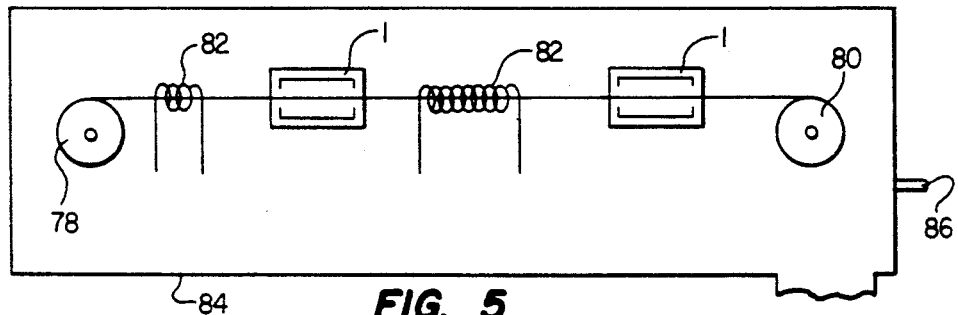
FIG. 5 is a schematic view of a configuration of an overall film deposition system according to the present invention.
Figure 6:
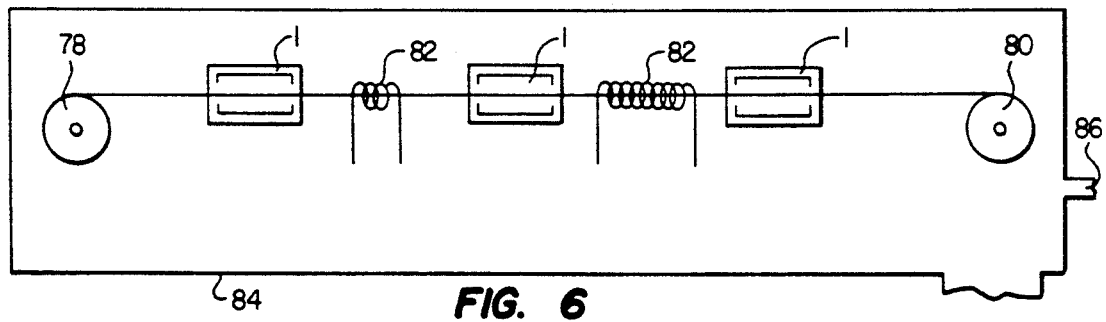
FIG. 6 is a second schematic view of a configuration of an overall film deposition system according to the present invention.
Figure 7:
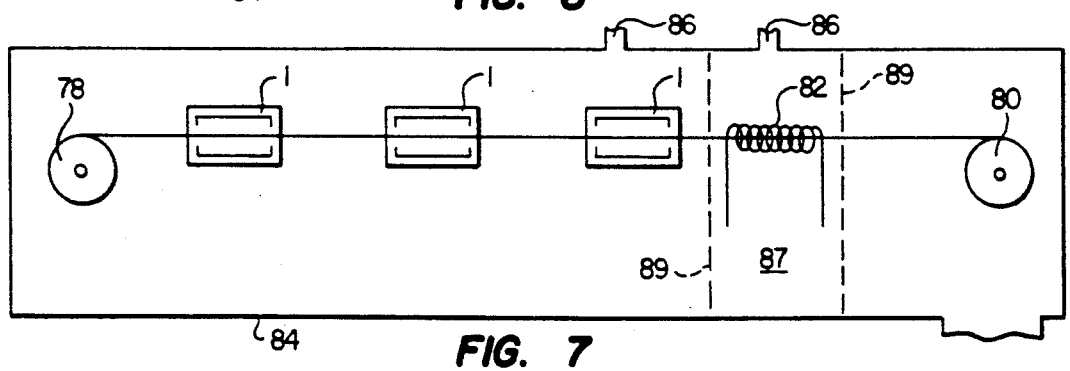
FIG. 7 is a third schematic view of a configuration of an overall film deposition system according to the present invention.

Referring now to FIGS. 5, 6 and 7, there are shown various embodiments of overall coating systems constructed in accordance with the system of the present invention. Each of the systems includes at least one CHCM 1 as well as at least one heating coil 82 (although it should be emphasized that embodiments of the present invention may not employ any heating coils) and wire moving means schematically indicated by the output and input reels, 78 and 80, respectively. The elements of each system are shown disposed in a vacuum chamber 84 which is evacuated and back-filled with a gaseous atmosphere as previously discussed. The system of FIG. 7 differs from the systems shown in FIGS. 5 and 6 in that a separate internal chamber 87 (signified by the dashed lines 89) is included so that annealing may be performed in a different gas and/or at a different pressure than deposition. This may be desirable in certain applications of the present invention. Internal walls or a complete internal chamber with small orifices therein to allow passage of the substrate or substrates therethrough can form a suitable internal chamber 87 in embodiments of the present invention. FIGS. 5, 6 and 7 show inlets 86 through which argon and/or some other gas may be introduced into the chambers 84 and/or 87. It should be noted that the heating of a substrate may take place before any deposition takes place as illustrated in the embodiment of FIG. 5. Alternatively, heating may take place only after all deposition has been completed as illustrated in the embodiment of FIG. 7 or intermediate the deposition of the various overlying layers as illustrated in the embodiment of FIG. 6.

All three of the illustrated embodiments shown in FIGS. 5, 6 and 7 include CHCM's placed in series so that the wire or other elongate cylindrical substrate passes through them sequentially, one after the other. The sputtering modules 1—1 may be placed in a single vacuum system, as illustrated in FIGS. 5-7 or in separate vacuum systems. In operation, such embodiments of the present invention containing a plurality of sequentially arranged modules 1—1 can deposit more than one layer of different materials on a wire. Each individual layer can serve different purposes, such as adhesion, conduction, and/or protection. The relative thicknesses of the various layers can be controlled by any of the various techniques discussed above, such as by varying the voltages applied to the different CHCM modules 1—1.

Figure 13:
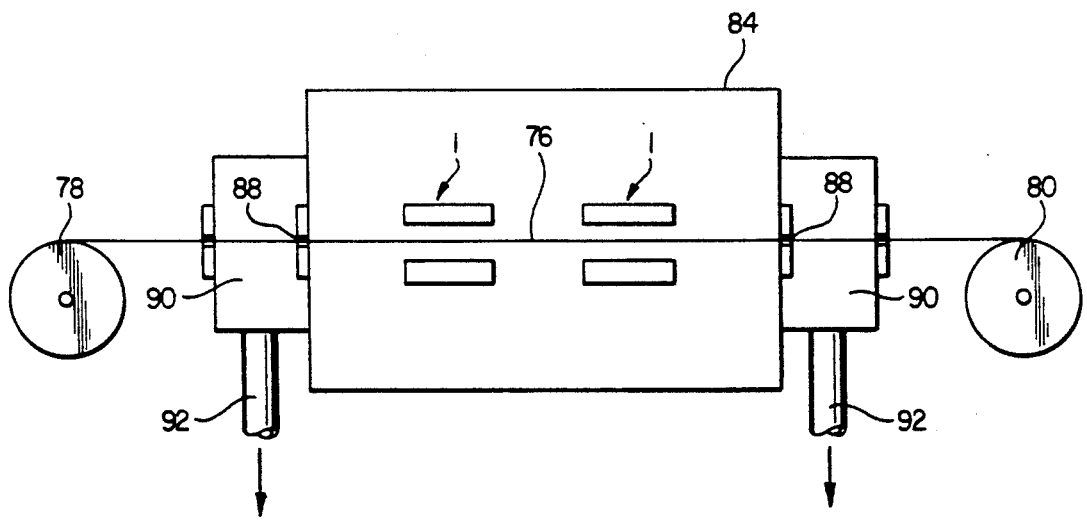
FIG. 13 is a schematic view of an overall film deposition system according to the teachings of the present invention.

Although the wire dispensing and take-up reels or spools 78, 80 are all shown as being disposed within a vacuum chamber 84 in FIGS. 5, 6, and 7, the wire dispensing and take-up spools may be placed outside such a chamber. FIG. 13 shows how this can be accomplished through the use of gas locking seals. First, the substrate being coated 76 is passed through very small orifices 88 in the wall of the chamber 84. Additionally, the orifices 88 are "in-line load-locked" by disposing load-lock chambers 90 between the orifices 88 and the ambient environment to minimize the risk of vacuum loss and/or air contamination. Load-lock chambers 90 are differentially pumped and/or purged (via conduits 92) with an appropriate gas.

It should be noted that there is no requirement that only a single wire be passed through a module at the same time in embodiments of the present invention. In the case of extremely small diameter wires, the shadowing effect due to the presence of adjacent wires upon one another is very small and a large number of wires can be coated uniformly at the same time. Because of this characteristic, as well as other characteristics of the present invention previously described, it should be readily apparent that the present invention is susceptible to being quickly and easily modified and/or properly scaled to coat cylindrical substrates in commercially practicable volumes.

Figure 14:
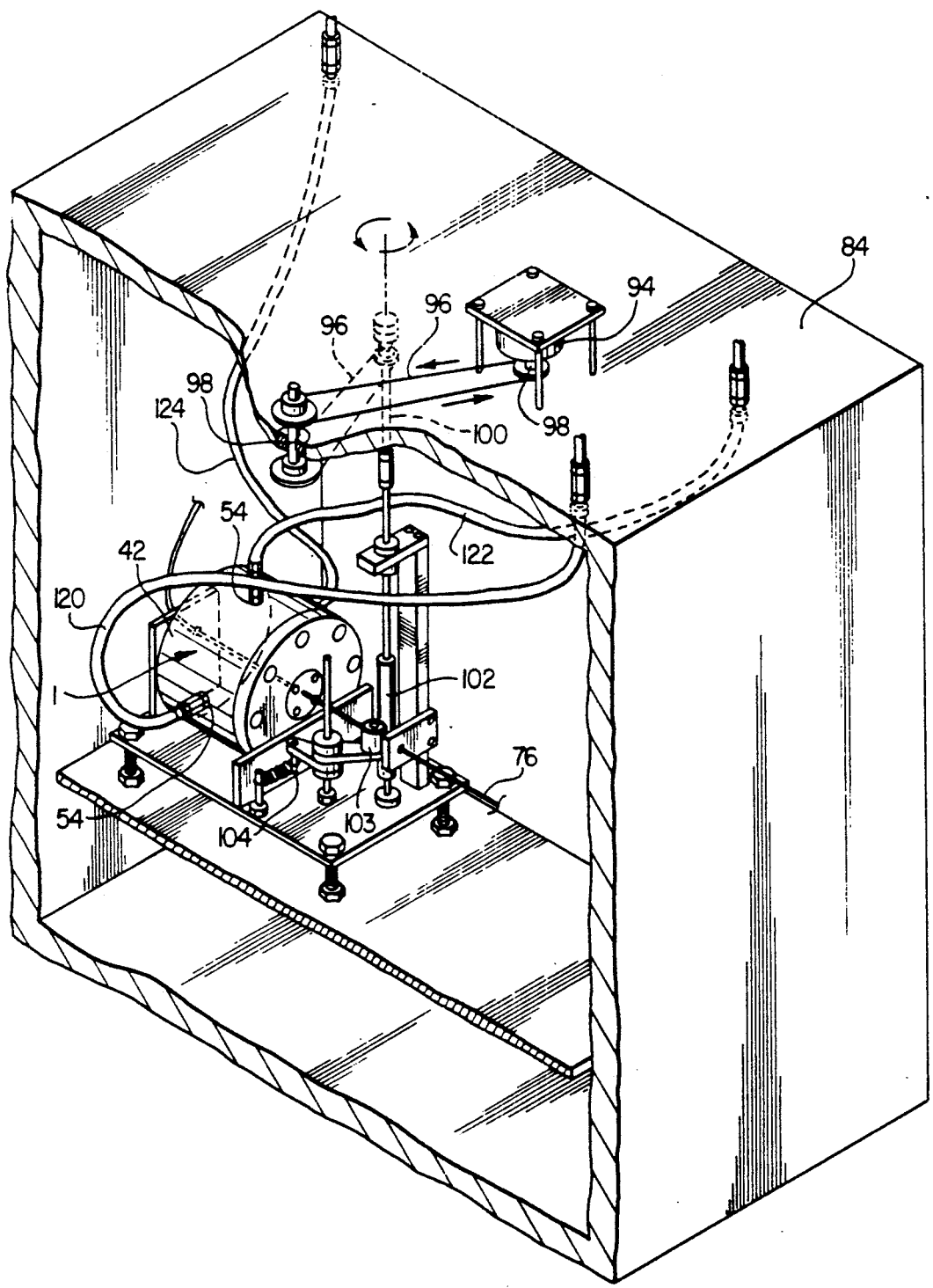
FIG. 14 is a cut away, perspective view of portions of an overall system according to the present invention.

Referring now to FIG. 14, shown therein are the details of a mechanical substrate moving system that has been constructed in accordance with the teachings of the present invention and found to work satisfactorily. This substrate moving system includes a small motor 94 mounted atop vacuum chamber 84. The rotary motion output shaft of motor 94 is transferred into linear motion and applied to substrate 76 by a pair of chains 96 that rotate sprockets mounted on a series of shafts 98, 100. Shaft 98 passes through a gas-tight seal from the outside to the inside of vacuum chamber 84 and shaft 100 is rotatably mounted within chamber 84 and connected to pinch roller 102. The substrate 76 is gripped between the driven pinch roller 102 and an idler pinch roller 103 which is spring biased toward the substrate by a mechanism 104. The two pinch rollers 102 and 103 effectively pull top wire 76 out of the CHCM 1. Of course, a multitude of other elongate substrate moving (and take-up spooling) means may be constructed. In view of the teachings of the present invention set forth herein, those skilled in the art should be readily able to construct any number of such systems.

Further with respect to FIG. 14, shown therein are how holes 54, discussed above in the discussion of FIG. 3, can be situated and used in embodiments of the present invention. In a preferred embodiment of the present invention, there are three such holes 54. One hole 54 is to allow coolant to be let into chamber 56, another hole 54 is to allow coolant to leave chamber 56, and the final hole 54 is to allow an electrical connection to be made to cathode 6. The coolant outlet hole 54 is generally positioned above the coolant inlet hole 54 so that coolant being pumped in forces the used coolant up and out of the sputtering system. In FIG. 14, tube 120 is connected to the coolant inlet hole 54, tube 122 is connected to the coolant outlet hole 54, and wire 124 leads to cathode 6 through yet another hole 54 (not shown).

Figure 8:
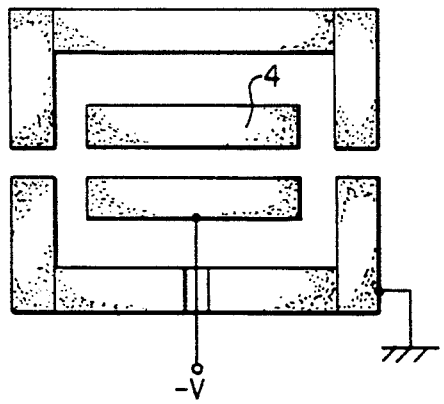
FIG. 8 is a schematic view of a sputtering source without any magnetic field imposed therein.

FIGS. 8, 9 and 10-12 illustrate certain important aspects of the present invention relating to the magnetic fields used to confine and enhance the plasma employed within the system. FIG. 8 shows a basic sputtering system which employs a cylindrical cathode 4 enclosed from the outside by plasma shields such that the plasma is generated inside the cathode. As previously discussed, any of a number of types of magnetic fields may be used to confine and enhance the plasma in the hollow cathode. Most effectively, the electric and magnetic fields are configured such that the E×B force on the electrons causes them to move into a path which closes on itself, resulting in entrapment of the electrons. A multitude of different effective magnetic fields may be employed, although only a few are described below.

Based on the E×B force principle, a number of plasma confinement configurations are possible which include axial magnetic fields, multipole fields, radial fields, monocusps, multicusps and highly divergent fields. Any one or a combination of these magnetic field configurations may be used to confine the plasma inside the hollow cathode 4.

Figure 9:
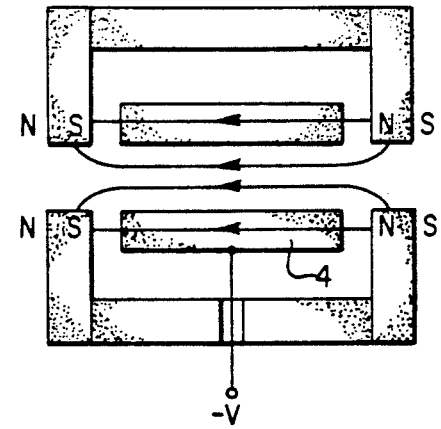
FIG. 9 is a schematic view of the source of FIG. 8 with a certain magnetic field therein.

A magnetic confinement method based on axial magnetic field geometry is illustrated in FIG. 9 in which the electrical and magnetic fields are such that the electrons are trapped in cycloid orbits around the anode, thereby increasing the plasma density.

Figure 10:
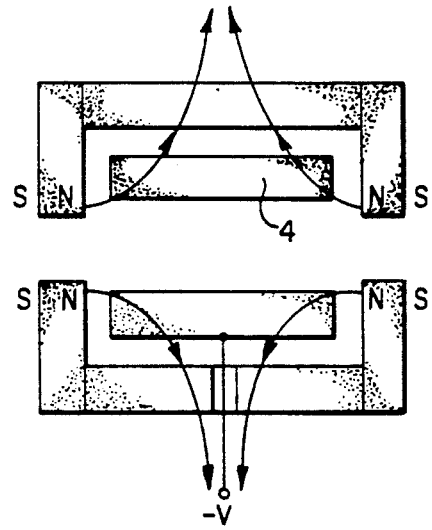
FIG. 10 is a schematic view of the source of FIG. 8 with a second certain magnetic field therein.

A cusped shaped magnetic field can also be used for confining the plasma in the middle of the cylindrical cathode, as illustrated in FIG. 10.

Figure 11:
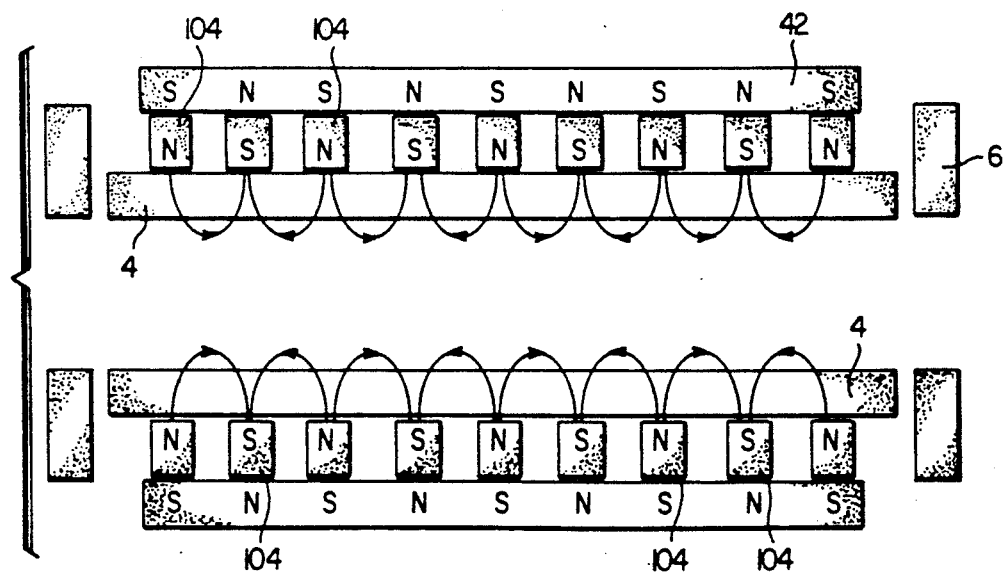
FIG. 11 is a schematic view of portions of a sputtering system according to the teachings of the present invention.

Another plasma confinement device based upon the multipole magnetic field configuration is illustrated in FIG. 11. A cylindrical cathode 4 is shown therein surrounded by a plurality of donut-shaped magnets of alternating polarity placed behind the cathode to create a magnetic field configuration which results in plasma confinement over a large range of plasma density. This type of magnetic field would be most preferred in embodiments of the present invention in which a very long hollow cathode is used to obtain a high throughput of coated wire passing through the system in a given period of time.

Figure 12:
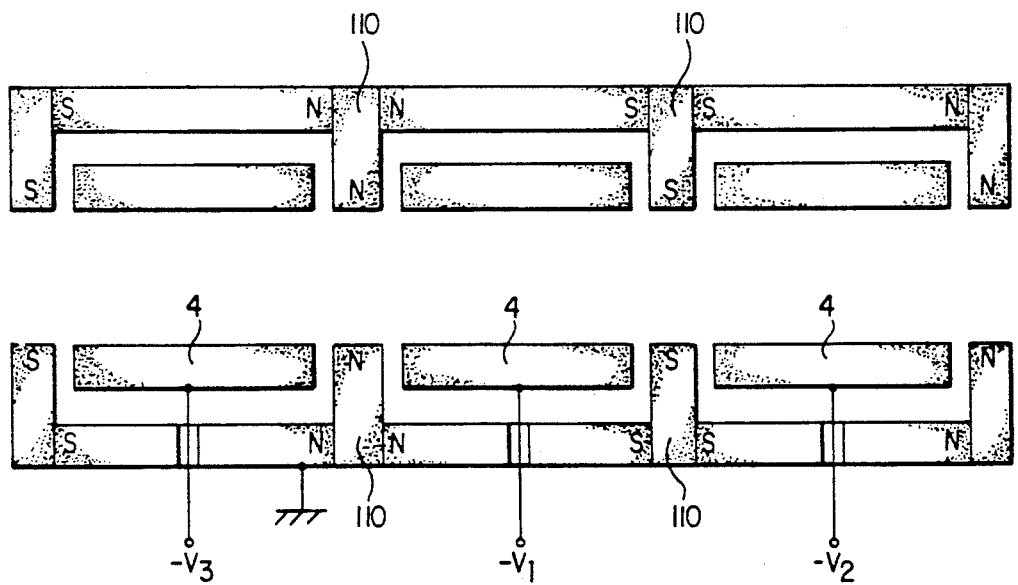
FIG. 12 is a schematic view of portions of a second sputtering system according to the teachings of the present invention.

FIG. 12 illustrates an embodiment of the present invention in which a plurality of cathodes 6 (three are shown in FIG. 12) are mechanically connected to one another so that magnetic pole-pieces 110 separate the cathodes. Staged deposition can be effected with such an embodiment in which sputter rates can be controlled by applying different voltages to the various cathodes.

In addition to the advantages of the present invention described above which relate to the use of permanent magnets, it should also be appreciated that a wide variety of different magnetic field configurations can be obtained in various embodiments of the present invention. By using selected magnetic fields for particular applications, it is possible to operate the sputtering module or modules over a very wide pressure range, i.e., from about $10^{-5}$ to about $3 \times 10^{-1}$ torr, and greatly enhance the versatility of the present invention. In yet another aspect of the present invention, plasma confinement can be used to reduce the electron bombardment on a fiber being coated. This feature is particularly useful in connection with temperature sensitive substrate materials. For example, Teflon materials are polymers and deposition must be effected at a temperature below their glass temperature.

As should be well appreciated by those skilled in the relevant art, a big obstacle in construction of the cylindrical hollow cathode magnetron heretofore described is target fabrication. Forming tubes of such materials as aluminum is quite easy; however, forming tubes of other materials, such as the high temperature superconducting (HTS) oxide YBaCuO, is generally recognized as being so difficult as to be virtually impossible.

In response to the difficulty discussed in the immediately preceding paragraph and to facilitate construction of embodiments of the present invention, the description which follows, and accompanying drawings FIGS. 15 to 23, generally describe and depict a number of ways in which cylindrical hollow cathodes can be formed from HTS materials.

Figure 15:
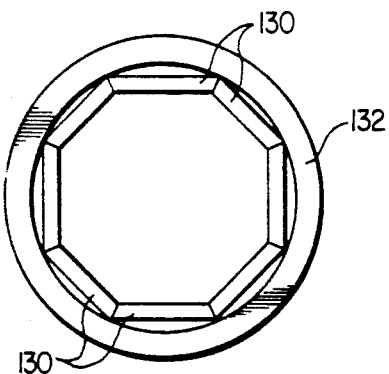
FIG. 15 is a top plan view of an embodiment of a cathode according to the teachings of the present invention.
Figure 16:
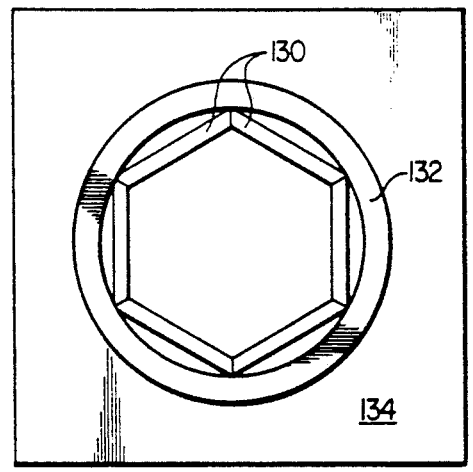
FIG. 16 is a view as per FIG. 15 of another embodiment of a cathode according to the teachings of the present invention, this FIG. also depicting a cooling means.
Figure 17:
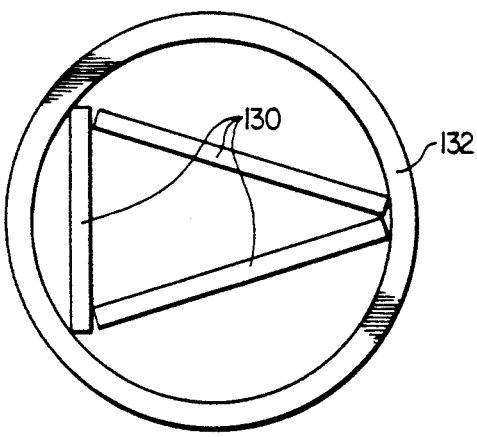
FIG. 17 is a view as per FIG. 15 of another embodiment of a cathode according to the teachings of the present invention.

Referring now specifically to FIG. 15, one solution to the target fabrication problem may be seen to involve strips of ceramic HTS material 130, which strips are bonded or soldered or otherwise attached to the inside of a hollow cathode backing plate 132. In FIG. 15 the strips are shown attached so as to have an octagonal cross section. Other forms, such as the ones shown in FIGS. 16 and 17 (i.e., having hexagonal and triangular cross sections respectively) are also possible. In preferred embodiments of the present invention having targets constructed by this method, the closer the internal cross section is to a circle the better. However, any polygonal configuration, down to and including the configuration of FIG. 17, could provide sufficient or otherwise acceptable thin film uniformity in particular applications. The thin strip material could be any ceramic material (including YBaCuO and the backing could be formed of copper or stainless steel or any other such material. As those skilled in the art should appreciate, attachment of the strips to the backing plate 132 may be facilitated at times if the backing plate 132 is cooled. To illustrate this and to indicate that such cooling may be employed in methods of constructing a system according to the teachings of the present invention, a cooling means, such as a refrigerated chamber 134, is shown schematically in FIG. 16.

Figure 18:
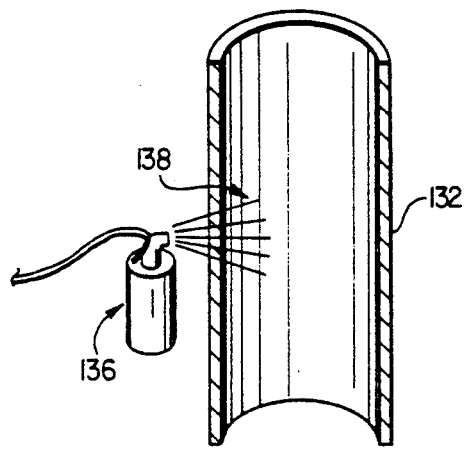
FIG. 18 is a cross sectional view of a cathode according to the teachings of the present invention together with a spraying means used in its formation.
Figure 19:
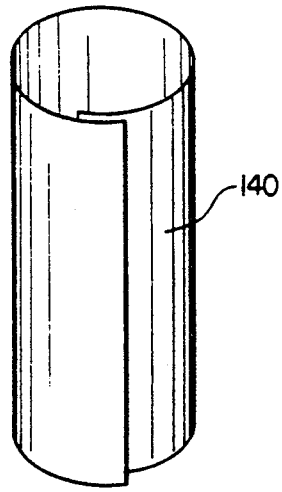
FIG. 19 is a perspective view of material that may be incorporated into embodiments of the present invention.

Referring now to FIG. 18, yet another solution to the target fabrication problem is generally depicted. This solution involves use of spraying means 136 to coat the inside of a hollow cathode 132 with a layer of HTS material 138. The structure and operation of such spraying means should be known or readily determinable by those skilled in the art. Many refinements of such spraying means have and are presently being made by various employees of the assignee of the present invention.

Figure 20:
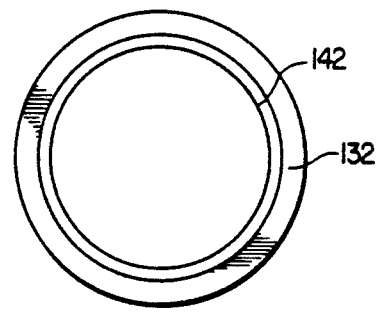
FIG. 20 is a top plan view of a cathode according to the teachings of the present invention.

Yet another solution to the target fabrication problem involves us of long rolled up strips of cathode material 140 (see FIG. 19) which can be bonded to the inside of a copper, stainless steel o similarly constituted cylinder. Related to such a solution is the process of machining HTS oxide material in the shape of a tube 142 and then epoxy bonding that tube to the inside of a cylinder 132. The final result of this latter process is generally illustrated in FIG. 20.

Figure 21:
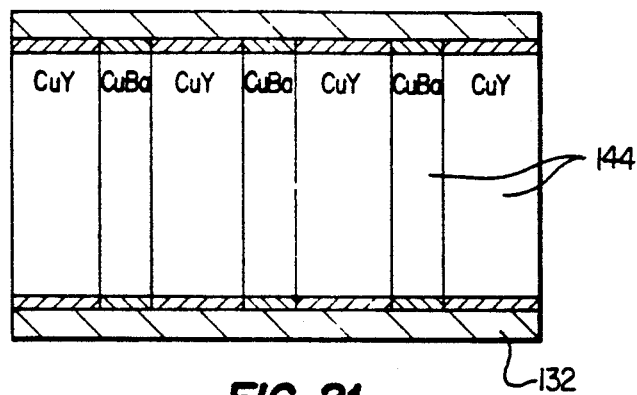
FIG. 21 is a cross sectional view of a cathode according to the teachings of the present invention.
Figure 24:
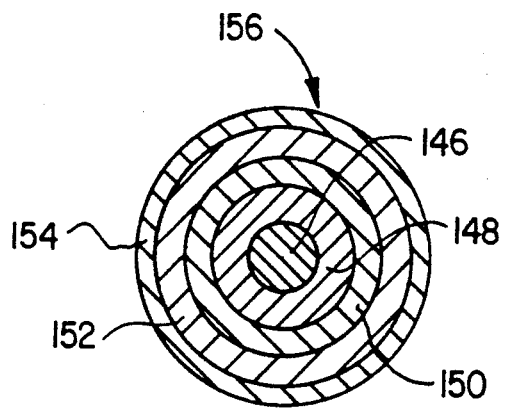
FIG. 24 is a cross sectional view of a superconducting wire constructed according to the teachings of the present invention.

Yet another approach developed by the inventor of the present invention is depicted in FIG. 21. This approach involves using binary alloys of various HTS materials, such as CuY and CuBa for YBCO. Thin strips of the binary alloys 144 can be positioned adjacent to each other in an alternating fashion around a cylindrical axis, and bonded to the inside of a hollow cylinder 132.

compounds which may be used to fabricate the superconducting wire of FIG. 24 is set forth below.

| Base Wire | Adhesion Layer | Diffusion Barrier Layer | Superconduction (HTS) Layer | Protection Layer |
|---|---|---|---|---|
| Yttria Stabilized Zirconia | None | None | $L_1Ba_2Cu_3O_x$ | None |
| $Al_2O_3$ (sintered or sapphire) | Ti Titanium | YSZ | [where L: Y, Nd, Sm, | Ag |
| $SiO_2$ (quartz) | Cr (Chromium) | $SrTiO_3$ | Eu, Gd, Dy, | Cu |
| W tungsten | TiW alloy | MgO | Ho, Er, Yb] | Al |
| Ni alloys | | $BaF_2$ | $Bi_2Sr_2CaCu_2O_8$ | |
| Ag (Silver) | | $ZrO_2$ | $Bi_2Sr_2Ca_2Cu_3O_{10}$ | |
| Cu (Copper) | | Ag | [Lead doping in $Bi_2Sr_2CaCu_2O_8$ and $Bi_2Sr_2Ca_2Cu_3O_{10}$] | |
| Ag alloys | | Au | $Tl_2Ba_2CaCu_2O_5$ | |
| | | TiN | $Tl_2Ba_2Ca_2Cu_3O_{10}$ | |
| | | TiW(N) | $TlBa_2Ca_2Cu_3O_9$ $TlBa_2CaCu_2O_7$ $Tl_2Ba_2Ca_3Cu_4O_{12}$ | |

The composition and relative areas of the various strips could be adjusted experimentally to obtain films with desired elemental concentrations. Bi or Tl compounds or HTS compounds developed in the future could be fabricated using similar binary or even ternary alloys.

Figure 22:
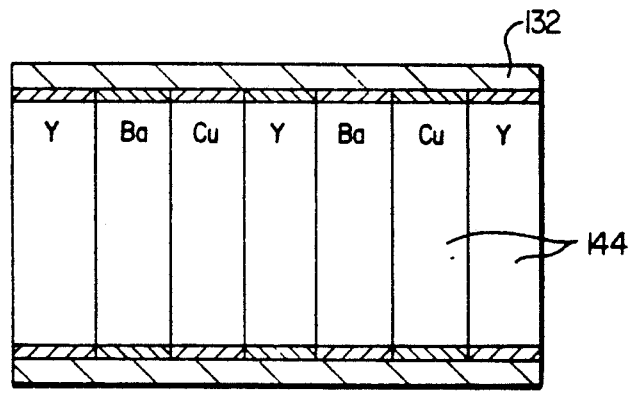
FIG. 22 is a cross sectional view of another cathode according to the teachings of the present invention.
Figure 23:
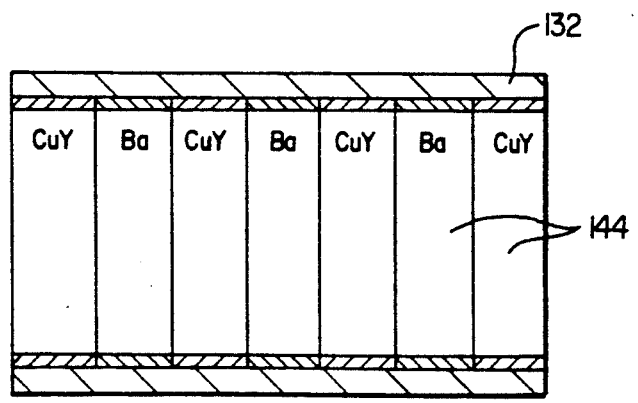
FIG. 23 is a cross sectional view of yet another cathode according to the teachings of the present invention.

FIG. 22 illustrates a variation of the approach discussed immediately above. FIG. 22 depicts us of pure elements instead of binary alloys. Also, as shown in FIG. 23, it may be desirable for creation of films of certain materials to use a combination of alloys and pure metals. In each of these cases, the strips are attached to a cylinder of copper or similar such material by bonding or similar means.

The system of the present invention, as described and illustrated herein, may used to deposit thin films of high current density HTS materials on thin metallic wires or ceramic fibers. Such HTS materials may include the compounds $YBa_2Cu_3O$, BiSiCaCuO, etc. Such thin metallic wires may include 1-10 mm thick Ag, Au or Cu wires. Such ceramic fibers may include carbon or graphite, $SiO_2$ or SiC. A suitable diffusion barrier layer, for example, TiN, $ZrO_2$ or ZrN, may be provided below the HTS film if desired. The diffusion barrier film may be deposited on the metallic wires or ceramic fibers using the techniques of the present invention.

Referring next to FIG. 24, a cross-sectional view of a superconducting wire constructed in accordance with the present invention may now be seen. According to FIG. 24, a plurality of layers may be deposited on a base wire 146 by a plurality of sequentially arranged CHCMs, each of which is capable of depositing a different material. Each of the plurality of layers may serve a different purpose, such as adhesion, diffusion, superconduction or protection. Hence, an adhesion layer 148, a diffusion barrier layer 150, a superconduction layer 152 and a protection layer 154 may be successively deposited by, for example, passing the base wire 146 through a series of four CHCMs placed one after the other to form a superconducting wire 156. The relative thickness of the various layers of the superconducting wire 156 may be controlled in accordance with the techniques described herein. In some applications, one or more of the adhesion layer 148, diffusion barrier layer 150 and protection layer 154 illustrated in FIG. 24 may not be present in the superconducting wire 156. While the composition of he base wire 146 and the layers 148, 150, 152, 154 will vary depending on the requirements of each application, an illustrative list of elements or In practice, it may be desired to group several superconducting wires of the type shown in FIG. 24 into a single composite wire. As discussed above, the superconducting wires may be fabricated using one of the coating systems shown in FIGS. 5, 6, 7 and described in connection therewith. Proper annealing of these wires may be performed either outside the vacuum chamber 84 in the oxygen atmosphere or inside the vacuum chamber 84 which is usually filled with a gas such as Ar or $O_2$ and provided with one or more heating coils 82 as illustrated in FIGS. 5, 6, 7. Once a number of superconducting wires have been formed, they may be grouped together into a composite wire using standard metal matrix composite techniques.

Figure 25:
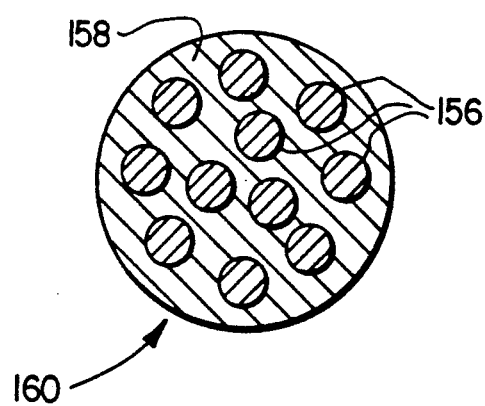
FIG. 25 is a cross sectional view of a composite superconducting wire constructed from a plurality of the superconducting wires shown in FIG. 24.

Referring now to FIG. 25, there is shown a cross-section of a composite superconducting wire constructed in accordance with the present invention. According to FIG. 25, a plurality of superconducting wires 156 is dispersed within a metal matrix 158. The metal matrix 158 may be formed, for example, from copper (Cu) or silver (Ag). A protective shield 160 surrounds the metal matrix 158. The protective shield 160 may be formed from suitable insulating material as is well known in the art. It will be appreciated by those of ordinary skill in the art that the use of the protective shield 160 may not be required in certain applications.

While certain other methods for fabricating superconducting wires may be suggested by the immediately preceding description and are encompassed by the present invention, the succeeding discussion will detail only one such other method. In this method, a thin intermediate or partial superconduction layer consisting of at least some, but not all, of the constituent elements of an HTS material is deposited on a base wire by a CHCM system. A final or complete superconduction layer is then formed by annealing and chemically reacting the intermediate or partial layer with the other or remaining elements of the HTS material in, for example, a separate furnace. As will be appreciated by those of ordinary skill in the art, it may be possible to react the intermediate or partial layer with the other elements of the HTS material, first, and, then, to anneal the resulting layer so as to form the final or complete superconduction layer. However, because the chemical reactions in the latter instance will be relatively slow, annealing should preferably be done while reacting the intermediate or partial layer with the other elements of the HTS material.

To illustrate, a superconducting wire comprised, for example, of a base wire made of consil (a silver alloy) material and a superconduction layer made of $Th_2Ba_2CaCu_3O_5$, may be formed by depositing a thin (for example, 8–10 um) layer of BaCaCuO on a consil wire using a CHCM having a cathode of appropriate stoichiometry. Following CHCM deposition, the consil wire and associated BaCaCuO layer are annealed in a post-deposition annealing furnace filled with Th under high pressure such that the Th reacts with the BaCaCuO to form the final $Th_2Ba_2CaCu_3O_5$ superconducting layer.

It is thus believed that the operation and construction of the present invention will be apparent from the foregoing description. While the superconducting wires and the methods and apparatus for fabrication thereof, shown and described herein, have been characterized as being preferred it will be obvious that various changes and modifications may be made therein without departing from the spirit and scope of the invention.

What is claimed is:

1. A method for fabricating a superconducting wire comprising the steps of:
   in a first means, sputter depositing on a base wire a partial superconduction layer consisting of at least some, but not all, of the elements of an HTS material; and
   in a second means, reacting said partial superconduction layer with the other element or elements, including at least one metallic element, of the HTS material so that a complete superconduction layer is formed on said base wire.

2. A method according to claim 1, wherein said base wire comprises consil, wherein said partial superconduction layer comprises BaCaCuO, and wherein step of reacting comprises the step of annealing said partial superconduction layer in a furnace filled with Th, whereby the Th reacts with the BaCaCuO to form a complete $Th_2Ba_2CaCu_3O_5$ superconduction layer.

3. An apparatus for fabricating a superconducting wire comprising:
   first means for sputter depositing on a continuously moving base wire a partial superconduction layer consisting of some, but not all, of the elements of an HTS material; and
   second means for reacting said partial superconduction layer on said continuously moving base wire with the other element or elements, including at least one metallic element, of the HTS material so that a complete superconduction layer is formed on said base wire.

4. An apparatus as recited in claim 3, wherein said means for reacting comprises an annealing furnace.

5. A system for fabricating a superconducting wire, said system comprising:
   a first means comprising a sputtering system for depositing on a continuously moving base wire a partial superconduction layer consisting of some, but not all, of the elements of an HTS material, said sputtering system including a cathode comprising a metallic outer cylinder and lengthwise arrayed target material disposed within said metallic outer cylinder so as to form a closed polygonal cross-sectional shape within said metallic outer cylinder; and
   second means for reacting said partial superconduction layer with the other element or elements of the HTS material so that a complete superconduction layer is formed on said continuously moving base wire.

6. A system as recited in claim 5, wherein said means for reacting comprises an annealing furnace.

* * * * *